(12) United States Patent
Won et al.

(10) Patent No.: US 12,048,145 B2
(45) Date of Patent: Jul. 23, 2024

(54) METHOD OF MANUFACTURING SEMICONDUCTOR STRUCTURE

(71) Applicant: CHANGXIN MEMORY TECHNOLOGIES, INC., Hefei (CN)

(72) Inventors: Daejoong Won, Hefei (CN); Soonbyung Park, Hefei (CN); Er-Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 242 days.

(21) Appl. No.: 17/602,937

(22) PCT Filed: Jul. 8, 2021

(86) PCT No.: PCT/CN2021/105288
§ 371 (c)(1),
(2) Date: Oct. 11, 2021

(87) PCT Pub. No.: WO2022/183655
PCT Pub. Date: Sep. 9, 2022

(65) Prior Publication Data
US 2023/0057316 A1    Feb. 23, 2023

(30) Foreign Application Priority Data

Mar. 1, 2021    (CN) .......................... 202110226661.6

(51) Int. Cl.
*H10B 12/00*    (2023.01)
(52) U.S. Cl.
CPC ........... *H10B 12/488* (2023.02); *H10B 12/09* (2023.02)
(58) Field of Classification Search
CPC ...... H10B 12/488; H10B 12/09; H10B 12/05; H10B 12/00; H10B 12/50; H10B 27/10891; H10B 27/10894
(Continued)

(56) References Cited

U.S. PATENT DOCUMENTS 8,120,099 B2    2/2012    Seo et al.
2005/0106887 A1    5/2005    Chen et al.
(Continued)

FOREIGN PATENT DOCUMENTS

CN    101944531 A    1/2011
CN    107482015 A    12/2017
(Continued)

OTHER PUBLICATIONS

International Search Report cited in PCT/CN2021/105288, mailed Dec. 2, 2021, 10 pages.

*Primary Examiner* — Jasmine J Clark
(74) *Attorney, Agent, or Firm* — Kilpatrick Townsend & Stockton LLP

(57) ABSTRACT

Embodiments of the present disclosure provide a method of manufacturing a semiconductor structure. The semiconductor structure includes a peripheral area and an array area, and the method of manufacturing a semiconductor structure includes: providing a substrate; where the substrate in the peripheral area includes an active layer; a first isolation layer is further provided on the active layer; forming a buried word line in the substrate in the array area; where a second isolation layer is further provided on the buried word line; the buried word line includes a first conductive layer and a second conductive layer; patterning the first isolation layer and the second isolation layer by dry etching to form first through holes and a second through hole; where the first through holes expose a top surface of the active layer, and the second through hole exposes the second conductive layer.

15 Claims, 4 Drawing Sheets

(58) Field of Classification Search
USPC .......................................................... 438/675
See application file for complete search history.

(56) References Cited

U.S. PATENT DOCUMENTS

2007/0287293 A1    12/2007  Han et al.
2017/0084710 A1*    3/2017  Koh ..................... H10B 12/033

FOREIGN PATENT DOCUMENTS

| CN | 110400838 A | * | 11/2019 | ............. H10B 12/50 |
| CN | 113035870 A | | 6/2021 | |
| KR | 100807596 B1 | | 2/2008 | |

* cited by examiner

US 12,048,145 B2

METHOD OF MANUFACTURING SEMICONDUCTOR STRUCTURE

CROSS-REFERENCE TO RELATED APPLICATIONS

The present disclosure is a national stage of International Patent Application No. PCT/CN2021/105288, filed on Jul. 8, 2021, which claims the priority to Chinese Patent Application No. 202110226661.6, titled "METHOD OF MANUFACTURING SEMICONDUCTOR STRUCTURE", filed to China National Intellectual Property Administration (CNIPA) on Mar. 1, 2021. The entire contents of International Patent Application No. PCT/CN2021/105288 and Chinese Patent Application No. 202110226661.6 are incorporated herein by reference.

TECHNICAL FIELD

The present disclosure relates to, but is not limited to, a method of manufacturing a semiconductor structure.

BACKGROUND

Dynamic random access memory (DRAM) is a type of semiconductor memory widely used in computer systems. The main principle of the DRAM is to use the amount of charge stored in a capacitor to represent whether a binary bit is 1 or 0.

The DRAM includes a substrate, a word line, a bit line, a transistor and a capacitor, etc. Among them, the word line is connected to the transistor and controls the access to the capacitor. The currently commonly used word line is a buried word line with dual work functions. However, the buried word line with dual work functions still has many problems, which will affect the performance of the semiconductor structure.

SUMMARY

An overview of the subject matter detailed in the present disclosure is provided below, which is not intended to limit the protection scope of the claims.

Embodiments of the present disclosure provide a method of manufacturing a semiconductor structure. The semiconductor structure includes a peripheral area and an array area, and the method of manufacturing a semiconductor structure includes: providing a substrate; where the substrate in the peripheral area includes an active layer; a first isolation layer is further provided on the active layer; forming a buried word line in the substrate in the array area; where a second isolation layer is further provided on the buried word line; the buried word line includes a first conductive layer and a second conductive layer, the first conductive layer and the second conductive layer are stacked; a material of the first conductive layer is different from a material of the second conductive layer; patterning the first isolation layer and the second isolation layer by dry etching to form first through holes and a second through hole; where the first through holes expose a top surface of the active layer, and the second through hole exposes the second conductive layer; and wet-etching the second conductive layer exposed by the second through hole until a top surface of the first conductive layer is exposed.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

As mentioned in the background, the buried word line with dual work functions still has many problems, which will affect the performance of the semiconductor structure.

Figure 1:
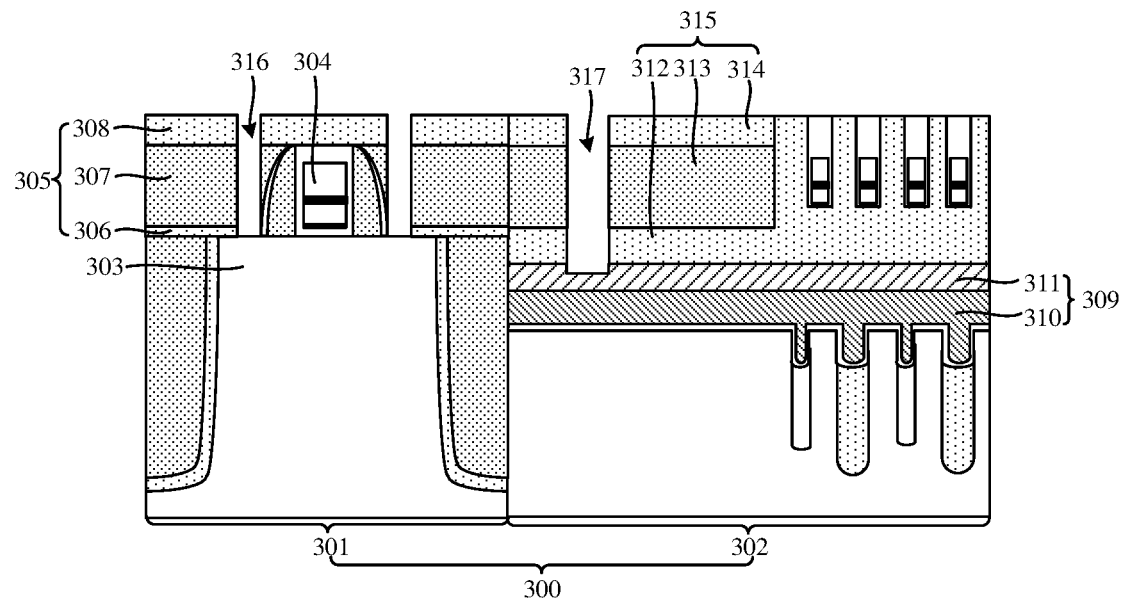
FIG. 1 is a view illustrating a structure obtained by implementing a step of forming first through holes and a second through hole of a semiconductor structure.
Figure 2:
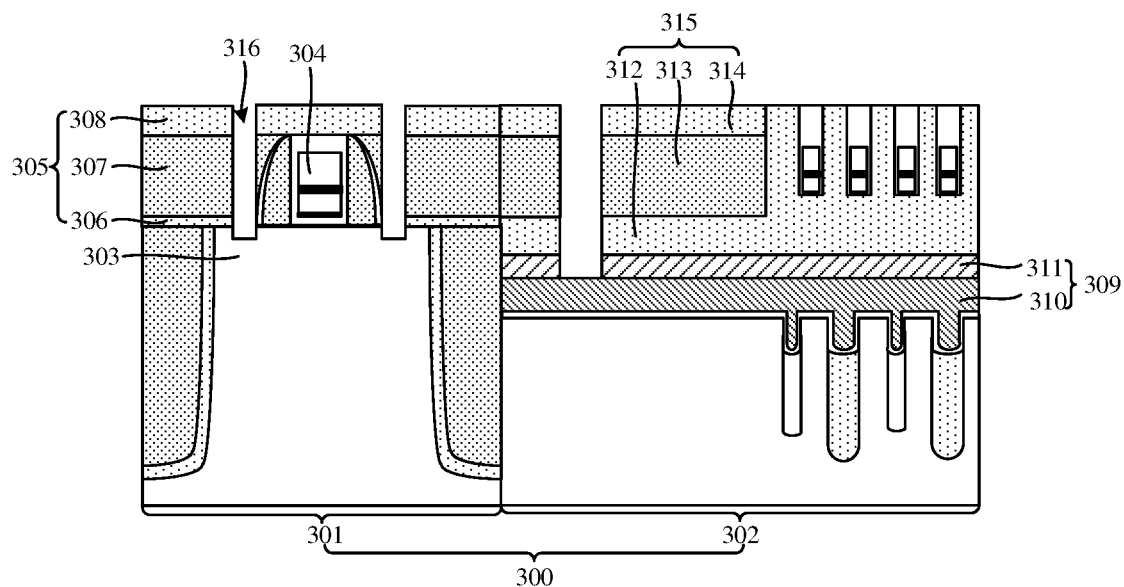
FIG. 2 is a view illustrating a structure obtained by implementing a step of forming first through holes and a second through hole of a semiconductor structure, which causes over-etching of a top surface of an active layer.

Referring to FIGS. 1 and 2, a semiconductor structure includes a peripheral area 301 and an array area 302. A substrate 300 in the peripheral area 301 includes an active layer 303. A first isolation layer 305 and a gate structure 304 are further provided on the active layer 303. The first isolation layer 305 includes a first lower structure 306, a first middle structure 307 and a first upper structure 308 that are stacked. A buried word line 309 is provided in the substrate 300 in the array area 302. A second isolation layer 315 is further provided on the buried word line 309. The second isolation layer 315 includes a second lower structure 312, a second middle structure 313 and a second upper structure 314 that are stacked. The buried word line 309 has dual work functions. The buried word line 309 includes a first conductive layer 310 and a second conductive layer 311 that are stacked. The first conductive layer 310 and the second conductive layer 311 have different work functions.

Referring to FIG. 1, the first isolation layer 305 and the second isolation layer 315 are patterned simultaneously by dry etching to form first through holes 316 and a second through hole 317. The material of the first conductive layer 310 is different from the material of the second conductive layer 311. The two conductive layers have different etch rates in the same etching process, and the second conductive layer 311 is prone to under-etching, such that the first conductive layer 310 cannot be exposed. In this case, a subsequently formed second contact layer filling the second through hole 317 will not be directly electrically connected to the first conductive layer 310, and the voltage on the second contact layer cannot be directly applied to the first conductive layer 310, thereby affecting the gate control capability of the semiconductor structure. Referring to FIG. 2, if the etching is continued to expose the first conductive layer 310, a top surface of the active layer 303 will be over-etched, thereby causing problems such as current leakage.

In order to avoid problems such as current leakage, the first isolation layer 305 and the second isolation layer 315 are usually dry-etched separately. In the step of dry-etching the second isolation layer 315, the second conductive layer 311 is also dry-etched until a top surface of the first conductive layer 310 is exposed. Alternatively, after the first isolation layer 305 and the second isolation layer 315 are simultaneously dry-etched, a mask is formed and the second conductive layer 311 is dry-etched. However, both of these two solutions require an additional photolithography step, which results in a complicated process.

An embodiment of the present disclosure provides a method of manufacturing a semiconductor structure. In this method, a first isolation layer and a second isolation layer are patterned simultaneously by dry etching to form first through holes and a second through hole. The first through holes expose a top surface of an active layer, and the second through hole exposes a second conductive layer. The second conductive layer exposed by the second through hole is wet-etched until a top surface of a first conductive layer is exposed. The embodiment of the present disclosure can simplify the manufacturing process, avoid damage to the active layer to cause leakage, and expose the first conductive layer to improve the electrical performance of the word line structure.

The embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure can be realized.

Figure 3:
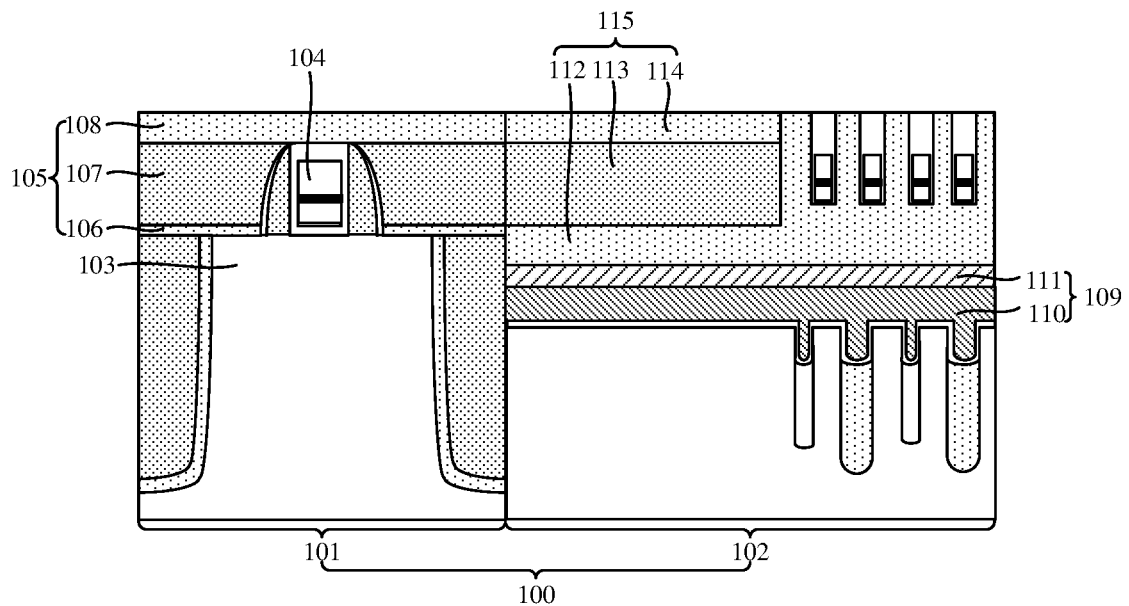
FIG. 3 is a view illustrating a structure obtained by implementing a step of providing a substrate of a semiconductor structure according to a first embodiment of the present disclosure.
Figure 4:
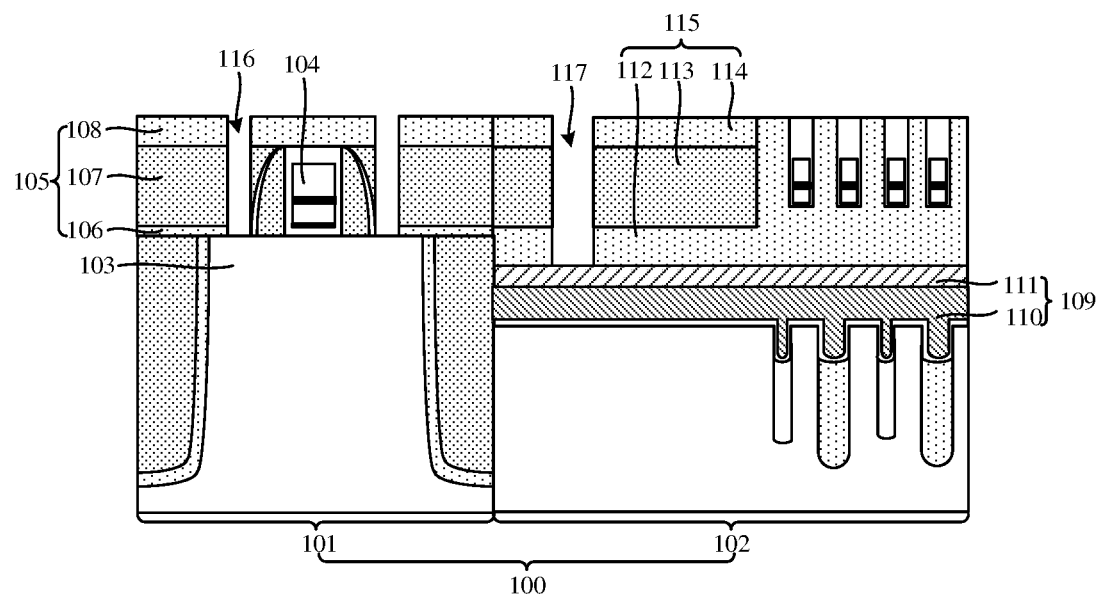
FIG. 4 is a view illustrating a structure obtained by implementing a step of forming first through holes and a second through hole of the semiconductor structure by dry etching according to the first embodiment of the present disclosure.
Figure 5:
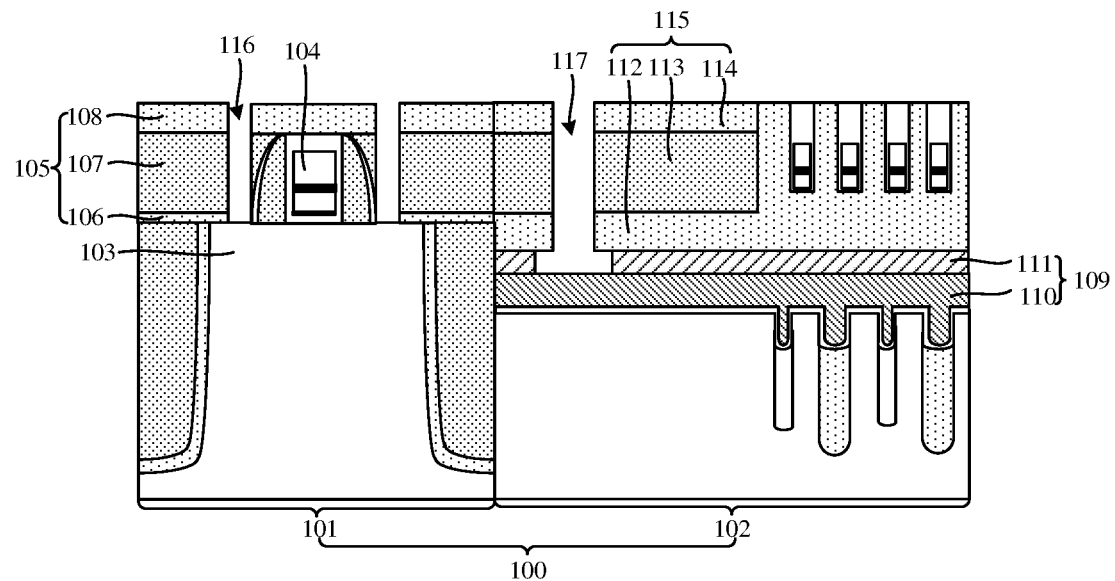
FIG. 5 is a view illustrating a structure obtained by implementing a step of wet-etching a second conductive layer of the semiconductor structure exposed by the second through hole according to the first embodiment of the present disclosure.

FIGS. 3 to 5 are views illustrating structures obtained by implementing various steps of a method of manufacturing a semiconductor structure according to an embodiment of the present disclosure, where the semiconductor structure includes a peripheral area and an array area. The method of manufacturing a semiconductor structure is described in detail below with reference to the drawings.

Referring to FIG. 3, a substrate 100 is provided. The substrate 100 includes two parts: a peripheral area 101 and an array area 102. The peripheral area 101 is mainly used to form a control circuit of the semiconductor structure, and the array area 102 is mainly used to form a word line and a bit line of the semiconductor structure, etc.

The substrate 100 in the peripheral area 101 includes an active layer 103, and a first isolation layer 105 is further provided on the active layer 103.

The active layer 103 and the first isolation layer 105 in the peripheral area 101 are described in detail below.

The active layer 103 is made of a single-crystalline semiconductor material, and the single-crystalline semiconductor material includes N-type doped ions or P-type doped ions. In this embodiment, the active layer 103 is made of monocrystalline silicon. In other embodiments, the active layer may also be made of monocrystalline germanium.

In this embodiment, the first isolation layer 105 has a multilayer structure, including a first lower structure 106, a first middle structure 107 and a first upper structure 108 that are stacked. The first lower structure 106 and the first upper structure 108 are made of the same material, which is a high-density material, such as silicon nitride or silicon oxynitride. The high-density material can reduce voids, thereby improving the isolation effect. The first middle structure 107 is made of a material with a fast deposition rate, such as silicon oxide or silicon nitride. The material with a fast deposition rate can shorten the process time and save the cost.

In other embodiments, the first isolation layer may also have a single-layer structure.

In this embodiment, a gate structure 104 is further provided on the active layer 103, and the first isolation layer 105 further covers the gate structure 104. The gate structure 104 includes structures such as a gate dielectric layer, a conductive layer and a barrier layer. A top surface and a sidewall of the gate structure 104 each are further provided with an insulating cap layer.

The substrate 100 in the array area 102 is provided with a buried word line 109, and a second isolation layer 115 is further provided on the buried word line 109.

The buried word line 109 and the second isolation layer 115 in the array area 102 are described in detail below.

The buried word line 109 includes a first conductive layer 110 and a second conductive layer 111 that are stacked, and the material of the first conductive layer 110 is different from the material of the second conductive layer 111.

In some embodiments of the present disclosure, the first conductive layer 110 is made of a low-resistance material, such as tungsten, tantalum or molybdenum. The low-resistance material can increase the conductivity of the first conductive layer 110, thereby increasing the operating speed of the semiconductor structure.

In this embodiment, the second conductive layer 111 is made of polysilicon. By doping the polysilicon by ion implantation, the buried word line 109 can have different resistivities and threshold voltages, so as to improve the electrical performance of the buried word line 109. In other embodiments, the second conductive layer may also be made of polycrystalline germanium, and the polycrystalline germanium may also have doped ions.

In this embodiment, the second isolation layer 115 has a multilayer structure, including a second lower structure 112, a second middle structure 113 and a second upper structure 114 that are stacked. The second lower structure 112 and second upper structure 114 are made of the same material, which is a high-density material, such as silicon nitride or silicon oxynitride. The high-density material can reduce voids, thereby improving the isolation effect. The second middle layer structure 113 is made of a material with a fast deposition rate, such as silicon oxide or silicon nitride. The material with a fast deposition rate can shorten the process time and save the cost.

Further, a top surface of the second lower structure 112 is flush with a top surface of the first lower structure 106. A top surface of the second middle structure 113 is flush with a top surface of the first middle structure 107. A top surface of the second upper structure 114 is flush with a top surface of the first upper structure 108. That is, the second lower structure 112 and the first lower structure 106 are formed in the same manufacturing step. The second middle structure 113 and the first middle structure 107 are formed in the same manufacturing step. The second upper structure 114 and the first upper structure 108 are formed in the same manufacturing step.

In other embodiments, the second isolation layer may also have a single-layer structure.

In this embodiment, a top surface of the second conductive layer 111 is lower than a top surface of the active layer 103. Therefore, the thickness of the second isolation layer 115 is greater than that of the first isolation layer 105.

Referring to FIG. 4, the first isolation layer 105 and the second isolation layer 115 are patterned by dry etching to form first through holes 116 and a second through hole 117. The first through holes 116 expose the top surface of the active layer 103, and the second through hole 117 exposes the second conductive layer 111.

In this embodiment, the second through hole 117 exposes the top surface of the second conductive layer 111. That is, during the dry etching process, the second conductive layer 111 is not etched, and the entire second conductive layer 111 is retained. Subsequently, the second conductive layer 111 will be removed by wet etching. In other embodiments, part of the thickness of the second conductive layer may also be removed by dry etching after the second isolation layer is removed. Subsequently, the remaining second conductive layer will be removed by wet etching.

In this embodiment, there is one second through hole 117, that is, each buried word line 109 corresponds to one second through hole 117.

There are two first through holes 116, and the two first through holes 116 are located on two sides of the gate structure 104.

In an extension direction perpendicular to the first through holes 116, the width of each of the first through holes 116 is less than the width of the second through hole 117. The main reason is as follows. Due to a loading effect, in the same etching process, a larger etching area leads to a greater etching depth. Since the thickness of the first isolation layer 105 is less than that of the second isolation layer 115, if the width of each of the first through holes 116 is the same as that of the second through hole 117, the active layer 103 may be over-etched, or the second isolation layer 115 may not be etched through. Therefore, the width of each of the first through holes 116 should be less than that of the second through hole 117.

In the extension direction perpendicular to the first through holes 116, the width of each of the first through holes 116 is 20-30 nm, for example, 22 nm, 25 nm or 28 nm; the width of the second through hole 117 is 40-60 nm, for example, 44 nm, 50 nm or 55 nm. When the widths of the first through holes 116 and the second through hole 117 are within the above range, in the dry etching, both the first isolation layer 105 and the second isolation layer 115 can be etched through, without causing over-etching of the active layer 103.

The dry etching process is described in detail below.

The etch selectivity of the first isolation layer 105 to the active layer 103 by the dry etching is less than 1:0.2. When the etch selectivity is within the above range, the first isolation layer 105 can be completely removed without causing great damage to the top surface of the active layer 103.

An etching gas used for the dry etching includes carbon tetrafluoride and hydrogen. The mixed gas of carbon tetrafluoride and hydrogen is easy to remove the first isolation layer 105 and the second isolation layer 115 made of materials such as silicon nitride and silicon oxide, and it is not easy to cause over-etching of the active layer 103.

The radio frequency power of the dry etching is 75-105 W, for example, 80 W, 90 W or 100 W. When the radio frequency power is within the above range, the ion beam has sufficient energy, which can improve the etch rate of the first isolation layer 105 and the second isolation layer 115, without causing great damage to the active layer 103. In some embodiments of the present disclosure, the radio frequency power may be 102 W. In this case, the dry etching has the largest etch selectivity for the first isolation layer 105 and the active layer 103.

Referring to FIG. 5, the second conductive layer 111 exposed by the second through hole 117 is wet-etched until a top surface of the first conductive layer 110 is exposed.

The wet etching does not require photolithography and other steps, thereby simplifying the production process. The wet etching process is described in detail below.

In this embodiment, the wet etching is to spray an etching solution directionally to the second through hole 117. The directional spraying can reduce the degree of corrosion of other structure by the etching solution.

In other embodiments, the entire semiconductor structure may be immersed in the etching solution, and the etch rate of the second conductive layer by the etching solution is greater than that of the active layer. The etch selectivity of the second conductive layer to the active layer is greater than 2:1. When the etch selectivity is within the above range, the second conductive layer can be completely removed without causing damage to the active layer.

In this embodiment, the concentrations of the doped ions will affect the etch selectivity of the second conductive layer 111 to the active layer 103. In an example, the active layer 103 and the second conductive layer 111 each are doped with boron atoms. When the concentrations of boron atoms in the second conductive layer 111 and the active layer 103 are $10^{18}$ atm./cm$^3$, respectively, the difference between the etch rate of the second conductive layer 111 and the etch rate of the active layer 103 is the largest.

The etching solution for the wet etching includes tetramethyl ammonium hydroxide. When the concentration of the tetramethyl ammonium hydroxide is 20%, the etch rate of the second conductive layer 111 can be increased without causing great damage to the semiconductor structure.

The etching temperature of the etching solution for the wet etching is 80° C. At the etching temperature of 80° C., the etch rate of the second conductive layer 111 can be increased without causing great damage to the semiconductor structure.

Figure 6:
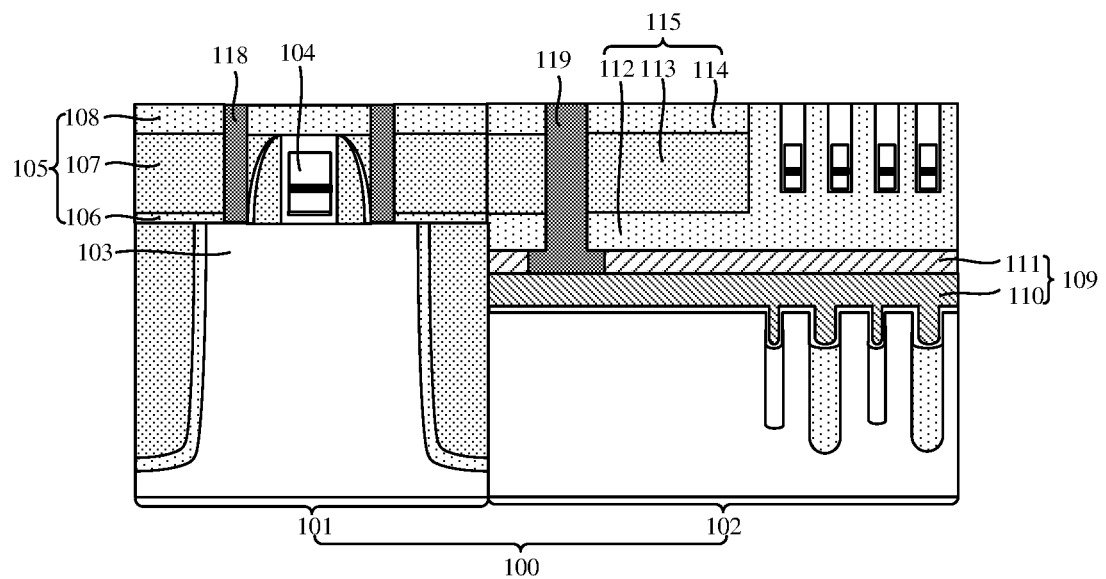
FIG. 6 is a view illustrating a structure obtained by implementing a step of forming a first contact layer and a second contact layer of the semiconductor structure according to the first embodiment of the present disclosure.

Referring to FIG. 6, after the wet etching, the method of manufacturing a semiconductor structure further includes: a first contact layer 118 filling the first through holes 116 (refer to FIG. 5) are formed, where the first contact layer 118 is electrically connected to the active layer 103; and a second contact layer 119 filling the second through hole 117 (refer to FIG. 5) are formed, where the second contact layer 119 is electrically connected to the first conductive layer 110 and the second conductive layer 111.

The wet etching can etch through the second conductive layer 111. Therefore, the second contact layer 119 can directly contact the first conductive layer 110, and the voltage on the second contact layer 119 can be directly applied to the first conductive layer 110, thereby improving the electrical performance of the semiconductor structure.

The first contact layer 118 is made of a low-resistance material, such as copper, tungsten or gold.

The second contact layer 119 is made of a low-resistance material, such as copper, tungsten or gold.

In this embodiment, the first contact layer 118 and the second contact layer 119 are formed as follows. An initial contact layer is formed in the first through holes 116 and the second through hole 117, and on surface of the first isolation layer 105 and surface of the second isolation layer 115. The initial contact layer is planarized to remove a part of the initial contact layer located on the surface of the first isolation layer 105 and the surface of the second isolation layer 115. A first remaining part of the initial contact layer in the first through holes 116 is the first contact layer 118, and a second remaining part of the initial contact layer in the second through hole 117 is the second contact layer 119.

In other embodiments, the first through hole and the second through hole may also be filled separately to form the first isolation layer and the second isolation layer.

In summary, in this embodiment, the dry etching and the wet etching are used in combination. The first isolation layer 105 and the second isolation layer 115 are penetrated by dry etching to expose the top surface of the active layer 103 and the top surface of the second conductive layer 111 respectively. The second conductive layer 111 exposed by the second through hole 117 is continuously etched by the wet etching, to expose the top surface of the first conductive layer 110. The combined etching method can expose the top surface of the first conductive layer 110 without over-etching the active layer 103, and can also simplify the production process and reduce the production cost.

Figure 7:
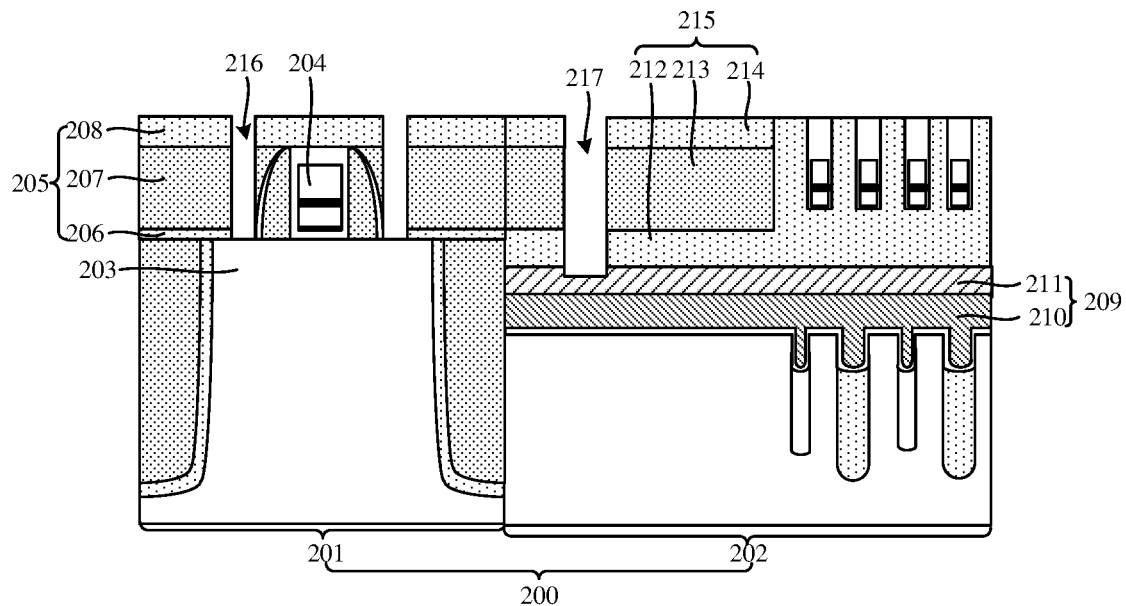
FIG. 7 is a view illustrating a structure obtained by implementing a step of forming first through holes and a second through hole of a semiconductor structure by dry etching according to a second embodiment of the present disclosure.
Figure 8:
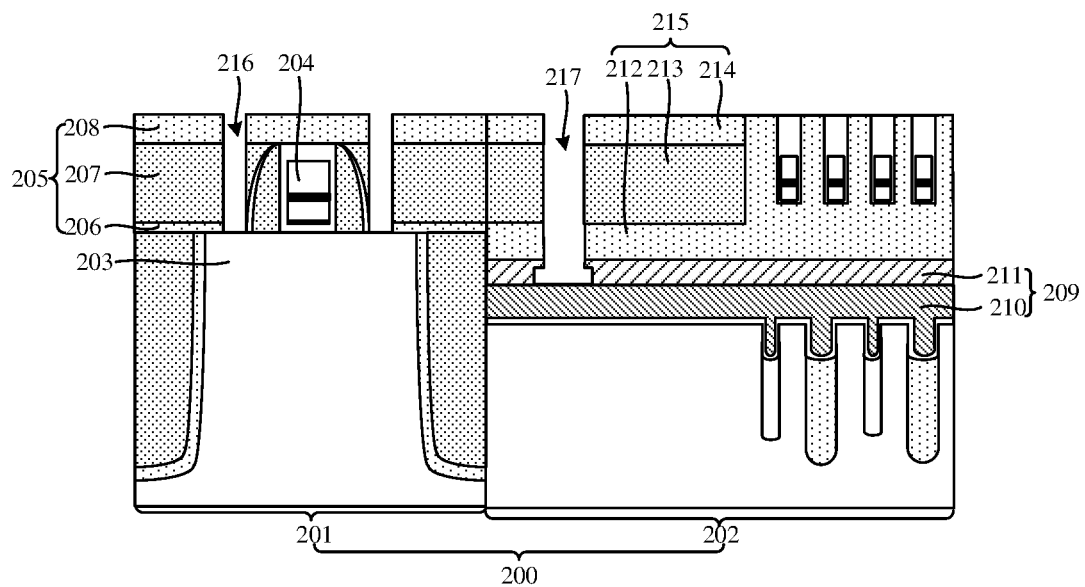
FIG. 8 is a view illustrating a structure obtained by implementing a step of wet-etching a second conductive layer of the semiconductor structure exposed by the second through hole according to the second embodiment of the present disclosure.

A second embodiment of the present disclosure provides a method of manufacturing a semiconductor structure. This embodiment is roughly the same as the first embodiment, with the main difference lying in that: in this embodiment, after the second isolation layer is patterned dry etching, the second conductive layer is further dry-etched to remove part of the second conductive layer, and the remaining second conductive layer is removed by wet etching. FIGS. 7 and 8 illustrate a method of manufacturing a semiconductor structure provided by the second embodiment of the present disclosure. The method of manufacturing a semiconductor structure is described in detail below with reference to the drawings.

Referring to FIG. 7, a substrate 200 is provided. The substrate 200 includes two parts: a peripheral area 201 and an array area 202. The substrate 200 in the peripheral area 201 includes an active layer 203, and a first isolation layer 205 is further provided on the active layer 203. The first isolation layer 205 includes a first lower structure 206, a first middle structure 207 and a first upper structure 208 that are stacked.

A gate structure 204 is further provided on the active layer 203, and the first isolation layer 205 further covers the gate structure 204.

A buried word line 209 is provided in the substrate 200 in the array area 202. A second isolation layer 215 is further provided on the buried word line 209. The buried word line 209 includes a first conductive layer 210 and a second conductive layer 211 that are stacked, and the material of the first conductive layer 210 is different from the material of the second conductive layer 211.

The second isolation layer 215 includes a first lower structure 212, a first middle structure 213 and a first upper structure 214 that are stacked.

Specific descriptions of the substrate 200, the buried word line 209, the first isolation layer 205 and the second isolation layer 215 may be referred to the first embodiment, which will not be repeated here.

The first isolation layer 205 and the second isolation layer 215 are patterned by dry etching to form first through holes 216 and a second through hole 217. The first through holes 216 expose a top surface of the active layer 203, and the second through hole 217 exposes the second conductive layer 211.

In this embodiment, after the second isolation layer 215 is dry-etched, the second conductive layer 211 is further dry-etched to remove part of the thickness of the second conductive layer 211. That is, the second through hole 217 exposes the top surface of the remaining second conductive layer 211. Subsequently, the remaining second conductive layer 211 will be wet-etched.

While the dry etching of the second conductive layer 211 is stopped, the dry etching of the first isolation layer 205 is stopped. At this time, the first isolation layer 205 is penetrated, and the top surface of the active layer 203 is not over-etched. That is, when the second isolation layer 215 is penetrated, the first isolation layer 205 is not penetrated, and the surface of the active layer 203 is not exposed. In order to achieve the above state, compared with the first embodiment, in this embodiment, the etch rate of the first isolation layer 205 is appropriately reduced, or the etch rate of the second isolation layer 215 is increased. Due to a loading effect, the etching area of the first isolation layer 205 can be reduced by reducing the width of each of the first through holes 216, thereby reducing the etch rate of the first isolation layer 205. Alternatively, the area of the second isolation layer 215 can be increased by increasing the width of the second through hole 217, thereby increasing the etch rate of the second isolation layer 215.

In an extension direction of the second through hole 217, the thickness of the part of the second conductive layer 211 removed by the dry etching is less than or equal to 45 nm. A greater thickness of the second conductive layer 211 removed by the dry etching requires a longer etching time. Therefore, in order to avoid over-etching of the active layer 203 by the dry etching, the thickness of the part of the second conductive layer 211 removed by the dry etching is less than or equal to 45 nm, so as to keep the dry etching time within a reasonable range.

Referring to FIG. 8, the second conductive layer 211 exposed by the second through hole 217 is wet-etched until a top surface of the first conductive layer 210 is exposed.

Part of the thickness of the second conductive layer 211 is removed by the dry etching. Therefore, in the wet etching process, the time for removing the remaining second conductive layer 211 can be shortened, so as to reduce damage to the semiconductor structure caused by the etching solution, thereby improving the yield of the semiconductor structure. In addition, the wet etching is isotropic, that is, the etching solution will etch a sidewall of the second through hole 217, thereby increasing the width of the bottom of the second through hole 217. Since the wet etching time is shortened, the etching degree of the sidewall of the second through hole 217 by the etching solution is reduced, which reduces the degree of expansion of the bottom of the second through hole 217, thereby reducing the influence on the electrical performance of the second conductive layer 211.

The specific description of the wet etching may be referred to the first embodiment, which will not be repeated here.

In summary, in this embodiment, the dry etching and the wet etching are used in combination. The first isolation layer 205 and the second isolation layer 215 are penetrated by dry etching, and part of the second conductive layer 211 is removed. The remaining second conductive layer 111 exposed by the second through hole 117 is etched by wet etching. The combined etching method can shorten the wet etching time, reduce the damage degree of the etching solution to the semiconductor structure, and reduce the influence of the etching solution on the electrical performance of the second conductive layer 211, thereby improving the yield of the semiconductor structure.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It should be understood that the terms such as "first" and "second" used herein may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The method of manufacturing a semiconductor structure provided by the embodiments of the present disclosure combines dry etching with wet etching, which can expose the top surface of the first conductive layer without over-etching the active layer, and simplify the production process and reduce the production cost.

The invention claimed is:

1. A method of manufacturing a semiconductor structure, the semiconductor structure comprising a peripheral area, an array area, and a substrate in the peripheral area and the array area, wherein the method of manufacturing a semiconductor structure comprises:
   providing the substrate; wherein the substrate in the peripheral area comprises an active layer; and a first isolation layer is further provided on the active layer;
   forming a buried word line in the substrate in the array area; wherein a second isolation layer is further provided on the buried word line, the buried word line comprises a first conductive layer and a second conductive layer, the first conductive layer and the second conductive layer are stacked, and a material of the first conductive layer is different from a material of the second conductive layer;
   patterning the first isolation layer and the second isolation layer by dry etching, to form first through holes and a second through hole; wherein the first through holes expose a top surface of the active layer, and the second through hole exposes the second conductive layer; and
   performing wet etching on the second conductive layer exposed by the second through hole until a top surface of the first conductive layer is exposed.

2. The method of manufacturing a semiconductor structure according to claim 1, wherein during the wet etching, an etch rate of the second conductive layer is greater than an etch rate of the active layer.

3. The method of manufacturing a semiconductor structure according to claim 2, wherein an etch selectivity of the second conductive layer to the active layer is greater than 2:1.

4. The method of manufacturing a semiconductor structure according to claim 3, wherein an etching solution for the wet etching comprises tetramethyl ammonium hydroxide.

5. The method of manufacturing a semiconductor structure according to claim 1, wherein the forming the second through hole exposing the second conductive layer comprises: removing a part of the second conductive layer by the dry etching, such that the second through hole exposes a remaining part of the second conductive layer.

6. The method of manufacturing a semiconductor structure according to claim 5, wherein in an extension direction of the second through hole, a thickness of the removed part of the second conductive layer is less than or equal to 45 nm.

7. The method of manufacturing a semiconductor structure according to claim 1, wherein an etch selectivity of the first isolation layer to the active layer by the dry etching is less than 1:0.2.

8. The method of manufacturing a semiconductor structure according to claim 7, wherein an etching gas used for the dry etching comprises carbon tetrafluoride and hydrogen.

9. The method of manufacturing a semiconductor structure according to claim 7, wherein a radio frequency power of the dry etching is 75-105 W.

10. The method of manufacturing a semiconductor structure according to claim 1, wherein the second conductive layer is made of a material comprising polysilicon or polycrystalline germanium.

11. The method of manufacturing a semiconductor structure according to claim 1, wherein after the wet etching, the method of manufacturing a semiconductor structure further comprises:
   forming a first contact layer filling the first through holes, wherein the first contact layer is electrically connected to the active layer; and
   forming a second contact layer filling the second through hole, wherein the second contact layer is electrically connected to the first conductive layer and the second conductive layer.

12. The method of manufacturing a semiconductor structure according to claim 11, wherein the forming the first contact layer and the forming the second contact layer are performed concurrently by:
   forming an initial contact layer in the first through holes and the second through hole, and on a surface of the first isolation layer and a surface of the second isolation layer;
   planarizing the initial contact layer to remove a part of the initial contact layer located on the surface of the first isolation layer and the surface of the second isolation layer, wherein the initial contact layer remaining in the first through holes is the first contact layer and the initial contact layer remaining in the second through hole is the second contact layer.

13. The method of manufacturing a semiconductor structure according to claim 1, wherein in an extension direction perpendicular to the first through holes, a width of each of the first through holes is less than a width of the second through hole.

14. The method of manufacturing a semiconductor structure according to claim 13, wherein in the extension direction perpendicular to the first through holes, the width of each of the first through holes is in a range of 20-30 nm, and the width of the second through hole is in a range of 40-60 nm.

15. The method of manufacturing a semiconductor structure according to claim 1, wherein a gate structure is further provided on the active layer, and the first isolation layer covers the gate structure, the first through holes comprise two first through holes, and the two first through holes are located on two sides of the gate structure.

* * * * *